(12) United States Patent
Kim

(10) Patent No.: US 9,515,454 B2
(45) Date of Patent: Dec. 6, 2016

(54) NARROW BANDWIDTH LASER DEVICE WITH WAVELENGTH STABILIZER

(71) Applicant: PHOVEL. CO. LTD., Daejeon (KR)

(72) Inventor: Jeong-Soo Kim, Gongju-si (KR)

(73) Assignee: PHOVEL. CO. LTD., Daejeon (KR)

( * ) Notice: Subject to any disclaimer, the term of this patent is extended or adjusted under 35 U.S.C. 154(b) by 0 days.

(21) Appl. No.: 14/399,676

(22) PCT Filed: May 12, 2014

(86) PCT No.: PCT/KR2014/004203
§ 371 (c)(1),
(2) Date: Nov. 7, 2014

(87) PCT Pub. No.: WO2014/200189
PCT Pub. Date: Dec. 18, 2014

(65) Prior Publication Data
US 2015/0200730 A1 Jul. 16, 2015

(30) Foreign Application Priority Data

| Jun. 10, 2013 | (KR) | 10-2013-0065649 |
| Jun. 19, 2013 | (KR) | 10-2013-0070571 |
| Jun. 21, 2013 | (KR) | 10-2013-0071344 |
| Jul. 17, 2013 | (KR) | 10-2013-0084198 |
| Feb. 14, 2014 | (KR) | 10-2014-0017299 |

(51) Int. Cl.
*H01S 3/10* (2006.01)
*H01S 5/00* (2006.01)
(Continued)

(52) U.S. Cl.
CPC ......... *H01S 5/0687* (2013.01); *H01S 5/02248* (2013.01); *H01S 5/02292* (2013.01);
(Continued)

(58) Field of Classification Search
CPC ............. H01S 5/0687; H01S 5/02415; H01S 5/06837; H01S 5/02248; H01S 5/02292; H01S 5/02212; H04B 10/503
See application file for complete search history.

(56) References Cited

U.S. PATENT DOCUMENTS 5,432,375 A * 7/1995 Agnvall ............... H01C 17/22
257/467
6,801,553 B2 10/2004 Imaki et al.
(Continued)

FOREIGN PATENT DOCUMENTS

| CN | 101689746 A | 3/2010 |
| JP | 2002237651 A | 8/2002 |

(Continued)

OTHER PUBLICATIONS

CLEO' 95( CLEO 1995, CTu10) by Chang-Hee Lee et al.
(Continued)

*Primary Examiner* — Yuanda Zhang
(74) *Attorney, Agent, or Firm* — Davis & Bujold PLLC; Michael J. Bujold

(57) ABSTRACT

A TO type laser device that can perform long-distance transmission due to a reduced line breadth of laser light. A semiconductor laser device which comprises a laser diode chip (100) that emits laser light; a wavelength-selective filter; a collimating lens (200) disposed in a light path between the laser diode chip (100) and the wavelength-selective filter and to collimate light emitted from the laser diode chip (100); a 45°-partial reflective mirror (300) disposed in a light path between the laser diode chip (100) and the wavelength-selective filter for changing laser light traveling parallel to the bottom of a package into laser light traveling perpendicularly to the bottom of the package; and an optical wavelength supervisory photodiode (500) disposed in a light path along which laser light reflecting from the wavelength-selective filter, after being emitted from the laser diode chip (100), passes through the 45°-partial reflective mirror (300).

19 Claims, 13 Drawing Sheets

(51) Int. Cl.
*H01S 5/0687* (2006.01)
*H04B 10/50* (2013.01)
*H01S 5/022* (2006.01)
*H01S 5/024* (2006.01)
*H01S 5/0683* (2006.01)

(52) U.S. Cl.
CPC ....... H01S5/02415 (2013.01); H01S 5/06837 (2013.01); H04B 10/503 (2013.01); *H01S 5/02212* (2013.01)

(56) References Cited

U.S. PATENT DOCUMENTS

| | | | |
|---|---|---|---|
| 6,965,622 B1* | 11/2005 | Cho | H01S 5/0612 372/33 |
| 8,235,605 B2 | 8/2012 | Kim | |
| 2001/0033592 A1 | 10/2001 | Yamauchi et al. | |
| 2008/0166134 A1* | 7/2008 | McCallion | G02B 6/12007 398/187 |
| 2009/0003843 A1* | 1/2009 | Oomori | H01S 5/0622 398/197 |
| 2010/0177793 A1* | 7/2010 | Rossi | H01S 5/141 372/20 |
| 2010/0226655 A1* | 9/2010 | Kim | G02B 6/4246 398/139 |
| 2015/0023672 A1* | 1/2015 | Dai | H04B 10/572 398/182 |

FOREIGN PATENT DOCUMENTS

| | | |
|---|---|---|
| JP | 2006165598 A | 6/2006 |
| KR | 100871011 B1 | 11/2008 |
| KR | 102010030486 A | 3/2010 |
| KR | 1020110094376 | 8/2011 |
| KR | 101124171 B1 | 3/2012 |

OTHER PUBLICATIONS

International Search Report issued in the corresponding PCT Application No. PCT/KR2014/004203 mailed Aug. 27, 2014.
Chinese Office Action dated Jul. 29, 2016 corresponding to the Chinese National Stage (201480001197.9) of PCT/KR2014/004201 filed on Nov. 7, 2014.

* cited by examiner

NARROW BANDWIDTH LASER DEVICE WITH WAVELENGTH STABILIZER

CROSS-REFERENCE TO RELATED APPLICATION(S)

This application claims the benefit under 35 U.S.C. §119 (a) of International Patent Application No. PCT/KR2014/004203, filed on May 12, 2014, the entire disclosure of which is incorporated herein by reference for all purposes.

FIELD OF THE INVENTION

The present invention relates to a laser device, particularly a laser device with a wavelength stabilizer that includes a wavelength stabilizer, can be subminiaturized, and can perform long-distance transmission due to reduction in line breadth of laser light emitted from a package.

BACKGROUND OF THE INVENTION

Recently, communication services with large communication capacity, including video service for smartphones, have been provided. Accordingly, there is a need for greatly increasing the existing communication capacity, and as a method of greatly increasing communication capacity, there are a method of increasing the bit rate used for optical communication and a WDM (wavelength division multiplexing) method that is a method of simultaneously transmitting optical signals having various wavelengths through one optical fiber. In the WDM method, a WDM method using two wavelengths of an optical signal at a band of 1310 nm and an optical signal at a band of 1550 nm were widely used, but recently, WDM (DWDM; Dense WDM) having a very dense frequency separation of 100 GHz and 50 GHz is adopted. Further, in order to further increase optical communication capacity, a method of increasing the bit rate of an optical signal having one wavelength and a WDM method of sending light having various wavelengths through one optical fiber have started being simultaneously applied.

However, in optical communication that modulates the intensity of laser light by supplying a current corresponding to "1" signal and "0" signal and analyzes signals according to a change in intensity of the light as "1" and "0" signals in a semiconductor laser diode, chirp in which laser light generated by a semiconductor laser diode chip changes in accordance with the magnitude of an injection current is generated. The "1" signal generally means a signal of a bit with large light intensity and a signal of light with small light intensity is called a "0" signal. In a semiconductor laser diode chip, more optical output is generated when the amount of an injected current is large, so the "1" signal described above corresponds to the case when a relatively large current flows in a laser diode chip, and the "0" signal corresponds to optical output the case when a relatively small current flows in a laser diode chip. For example, at a modulation speed in the 10 Gbps class, a wavelength change of about 5 GHz to 10 GHz is generated between a "1" signal and a "0" signal and such a wavelength difference is called chirp. In common DFB-LD, a "1" signal increases in frequency by about 5 GHz to 10 GHz in comparison to a "0" signal, so the wavelength of the "1" signal is shorter than the wavelength of the "0" signal. In an optical fiber, the propagation speed of light depends on the wavelength of the light due to dispersion and the dispersion changes the transmission speed of a "1" signal and a "0" signal in accordance with a chirp characteristic that is generated when a semiconductor laser is driven by "1" and "0", so when an optical signal reaches an optical receiver, the "1" signal and the "0" signal are mixed and it is difficult to separate the signals.

This phenomenon is more serious, particularly when a bit rate is high and the transmission distance is large, and accordingly, optical transmission of an optical signal generated in a semiconductor laser at a band of 1550 nm driven in the 10 Gbps class to 10 Km or more is very difficult and even optical transmission to 5 Km is difficult in some cases.

In order to operate a semiconductor laser diode chip at a high speed in the 10 Gbps class, it is required to supply a bias current corresponding to a "0" signal and a modulation current corresponding to a "1" signal, in which a bias current flows to the semiconductor laser diode chip in response to the "0" signal and a current produced by adding the modulation current to the bias current flows in response to the "1" signal.

For high-speed communication in the 10 Gbps class, optical response of a semiconductor laser diode to a signal having an RF (radio frequency) frequency of 10 Gbps need to be quick, but it is preferable to increase a bias current in order to increase optical response to an RF electric signal of a semiconductor laser diode. The magnitude of the modulation current depends on the characteristics of an electronic circuit driving a semiconductor laser diode chip and it is preferable to decrease the magnitude of the modulation current in order to give an electronic circuit a high frequency response characteristic. Accordingly, in order to improve an RF response characteristic of a semiconductor laser diode, a bias current flowing to the semiconductor diode chip is increased, and when it has a modulation current magnitude of a low current to improve an RF characteristic of a driving circuit of a semiconductor laser diode, the difference in intensity of an optical signal corresponding to "1" and an optical signal corresponding to "0" becomes small. The ratio of the intensity of an optical signal corresponding to "1" and the intensity of an optical signal corresponding to "0" is called an ER (extinction ratio). When the ER is low, "1" and "0" signal are mixed at an optical receiving terminal due to chirp in a semiconductor laser diode chip and dispersion in an optical fiber, so it becomes difficult to decode an optical signal at the optical receiving terminal. It is possible to reduce mixing of optical signals due to chirp in a semiconductor laser diode chip and dispersion in an optical fiber by increasing the ER, but it is required to decrease the bias current and increase the modulation current in order to increase the ER. However, when the bias current decreases, the optical response speed of the semiconductor laser diode chip to an electric signal decreases, and when the magnitude of modulation increases, the response speed of a driving circuit for driving the semiconductor laser diode chip decreases.

In order to solve this problem, Chang-Hee Lee et al, have shown that longer-distance transmission is possible, as compared with when laser light outputted from a semiconductor laser diode chip is not optically filtered, by improving ER in a way of removing or reducing a "0" signal by optically filtering laser light outputted from a DFB-LD (Distributed feedback laser diode) light source in CLEO' 95 (CLE) 1995, CTuI10). When a transmission band wavelength of an optical filter is set to "1", a "0" signal having a longer wavelength than the "1" signal is blocked by the optical filter, so the intensity of the "0" signal transmitted to an optical fiber is weakened relatively to the "1" signal, so the ER increases and an optical receive easily receives an optical signal, and accordingly, it is possible to transmit an optical signal to a longer distance. Therefore, the line breadth of the transmission band of an optical filter needs to have a difference in transmittance at a meaningful level in accordance with the difference in wavelength of a "1" signal and a "0" signal and the difference in transmittance can be adjusted to the transmission band line breadth of the optical filter. As described above, since there is a frequency difference of about 5 GHz to 10 GHz between a "1" signal and a "0" signal, the line breadth of the transmission wavelength band of an optical filter is required to be set to show a meaningful difference in transmittance for such a level of wavelength difference.

In the reference, CLEO' 95(CLEO 1995, CTul10) by Chang-Hee Lee et al., 13 dB bandwidth of the transmittance band of an optical filter is set to 12 GHz, but it is preferable to use an appropriate value at 5 GHz to 30 GHz for the transmission bandwidth of an optical filter. For the optical filter, an optical filter having one transmission wavelength band peak at a wavelength band of at least 10 nm to 100 nm can be used, but a filter having a plurality of transmission wavelength bands at the wavelength band may be used. In an optical filter having a plurality of transmission wavelength bands, the −3 dB bandwidth described above is defined as a −3 dB bandwidth of any one transmission wavelength peak. When it has a plurality of transmission wavelength bands, the frequency differences between the plurality of transmission wavelength bands should be larger at least than −3 dB width of the transmission wavelength band.

On the other hand, in a DFB-LD type of semiconductor laser, the wavelength depends on the operation temperature, and it usually has a wavelength change rate of about 0.1 nm/° C. Accordingly, a semiconductor laser diode chip has a wavelength change of about 12.5 nm in accordance with an environment temperature change of −40° C. to 85° C. Therefore, when an adjacent wavelength drops by about 20 nm, it is possible to remove mixing of wavelength even if the temperature of a semiconductor laser diode chip is not adjusted. Accordingly, an optical signal having a wavelength separation of 20 nm or more is generally used without the temperature of a semiconductor diode chip adjusted. However, when the wavelength separation from an adjacent wavelength is within 10 nm, it is required to keep the temperature of a semiconductor laser diode chip constant, using a thermoelectric element in order to suppress a temperature change of the semiconductor laser diode chip.

In high-speed optical communication in the 10 Gbps class, chirp in a DFB-LD and dispersion in an optical fiber are generated regardless of the operation temperature of a semiconductor laser diode chip, so for long-distance high-speed optical communication in the 10 Gbps class, it is required to optically filter optical signals outputted from a semiconductor laser diode regardless of the wavelength separation between wavelengths used in the optical communication.

Further, the product of SFP (small form factor pluggable), which is an optical communication module that is being internationally standardized at present, has a very small internal standard, so there is a need for a compact optical element. At present, there are package housings such as a TO (transistor outline) type, a mini flat type, and a butterfly type as packages for mounting a semiconductor laser chip, in which the TO type package is very small in volume and its price is relatively very low, so it is actively used for an optical communication network for a subscriber that requires a large quantity. However, a package in which an optical filter for increasing an ER that is the ratio of "1" signals and "0" signals by optically filtering laser light emitted from a DFB-LD chip and a DFB-LD chip is disposed in an existing TO type package has not been reported yet.

Since the oscillation wavelength changes in accordance with the operation temperature in a semiconductor laser diode chip, in order to effectively transmit a "1" signal and effectively block a "0" signal, in the laser light signals emitted from a semiconductor laser diode chip, it is required to keep a predetermined relationship between the wavelength of laser light emitted from the semiconductor laser diode chip and the transmission band wavelength of an optical filter, in accordance with a change in environmental external temperature. If it is not, the "1" signal that is supposed to be transmitted is blocked and the "0" signal that is supposed to be blocked is transmitted well, so optical communication becomes difficult.

As a prior art document, there is Korean Patent Publication No. 10-1124171 (Feb. 29, 2012).

SUMMARY OF THE INVENTION

Technical Problem

In DFB-LD used in high-speed optical communication, the adjacent optical communication wavelength channel separation may over 20 nm and an optical communication wavelength channel separation may have a wavelength separation of 50 GHz or 100 GHz, when it is converted into a frequency. In particular, when the wavelength channel separation in optical communication is 50 GHz or 100 GHz, a wavelength-variable light source that uses one DFB-LD chip as a light source module corresponding to a plurality of optical wavelengths in optical communication in the DWDM class can be used, using a wavelength change according to the temperature of DFB-LD.

In long-distance optical communication at a high speed in the 10 Gbps class, since it is preferable to use a TO type package to reduce the cost of an optical module, there is a need for a method of optically filtering a laser optical signal to increase the ER of an optical signal even if the wavelength of DFB-LD is not adjusted because the wavelength separation of optical communication is 20 nm or more, and there is a need for a method of optically filtering a laser optical signal to increase the ER of an optical signal even if the temperature of DFB-LD is kept constant because an adjacent wavelength channel has a wavelength separation in the DWDM class. Further, even in a wavelength-variable laser type that can applies one optical element to wavelength of several channels by changing the wavelength of DFB-LD by changing the temperature of semiconductor laser diode chip in optical communication in the DWDM class, there is a need for a method of optically filtering a laser optical signal to increase the ER of an optical signal.

For the high-speed communication of the present invention, a method of enabling long-distance optical communication by optically filtering laser light emitted from a semiconductor laser diode chip in a process of packaging DFB-LD using a TO type package is proposed, in which there are proposed an optical filtering method when there is no need to keep the operation temperature of DFB-LD constant, a method of optically filtering laser light in a TO type package, when DFB-LD is adjusted to have a constant wavelength by keeping the temperature of the DFB-LD constant, using a thermoelectric element regardless of a temperature change of the external environment, and a method of achieving long-distance communication by mounting an optical filter on a TO type package, when DFB-LD is used as a wavelength-variable laser in optical communication in the DWDM class by changing the wavelength of the DFB-LD using a thermoelectric element.

Technical Solution

To this end, a laser device according to the present invention includes; a laser diode chip that emits laser light; a wavelength-selective filter; a collimating lens that is disposed in a light path between the laser diode chip and the wavelength-selective filter and collimates light emitted from the laser diode chip; a 45°-partial reflective mirror that is disposed in a light path between the laser diode chip and the wavelength-selective filter and changes laser light traveling parallel to the bottom of a package into laser light traveling perpendicularly to the bottom of the package; and an optical wavelength supervisory photodiode that is disposed in a light path along which laser light reflecting from the wavelength-selective filter after being emitted from the laser diode chip passes through the 45°-partial reflective mirror.

When a semiconductor laser diode having wave stability in the DWDM class is used, when an optical element is used for a specific wavelength, or when a tunable laser corresponding to various wavelengths with a separation of 50 GHz or 100 GHz by changing the temperature of a semiconductor laser diode chip is used, it is preferable that the laser diode chip and the wavelength-selective filter are disposed on one thermoelectric element. Accordingly, when the temperature of a laser diode chip is adjusted by a thermoelectric elements, the oscillating wavelength of the laser diode chip is adjusted by the thermoelectric element such that a "1" signal relatively passes well through the wavelength-selective filter and a "0" signal cannot relatively pass well through the wavelength-selective filter, such that the ER of laser light transmitted to an optical fiber is larger than the ER emitted from the laser diode chip and long-distance transmission is possible.

When the temperature of the laser diode chip is not adjusted, it is possible to increase the ER by changing the temperature of the wavelength-selective filter such that the transmissive wavelength band of the wavelength-selective filter transmits a "1" signal relatively well and relatively further blocks a "0" signal, so it is possible to transmit a high-speed signal far away. Further, when the temperature of the laser diode chip is not adjusted, a method of maintaining a predetermined wavelength separation between the wavelength of laser light and the transmissive wavelength of the wavelength-selective filter by adjusting the temperature of the wavelength-selective filter, using a heater, consumes a less amount of electricity, as compared with a method of maintaining a predetermined relationship between the wavelength of laser light and the wavelength band of the wavelength-selective filter, using a thermoelectric element. Although a thermoelectric element consumes more electricity when operating in a cooling mode, in order to discharge a predetermined wavelength by keeping the temperature of the laser diode chip constant, the temperature of the laser diode chip is used for a heating mode or a cooling mode in accordance with a change in external environment temperature, but the temperature of the wavelength-selective filter adjusts only the relative intensity of the "1" signal and the "0" signal without changing the wavelength of laser light, so the temperature of the wavelength-selective filter can always be controlled in a heating mode.

Further, it is preferable that the wavelength-selective filter is an FP type etalon filter and the wavelength-selective filter may be manufactured by stacking dielectric thin films having high and low refractive indexes on a transparent substrate for the wavelength of concerned laser light. The wavelength-selective filter may be a filter having one transmissive peak or several transmissive peaks in the wavelength period of a temperature change of the laser diode chip.

As described above, when the wavelength-selective filter has several transmissive wavelength peaks, the relationship between the several transmissive peaks of the wavelength-selective filter is variously applied in accordance with the applying type.

In particular, when the temperature of a semiconductor laser diode chip is not adjusted and the wavelength of the semiconductor laser diode chip changes in accordance with an external environment temperature and when a semiconductor laser diode chip is operated for a predetermined specific wavelength, one or a plurality of wavelength separations can be applied to the transmissive wavelength peak of the wavelength-selective filter.

However, in an optical element having a tunable characteristic by adjusting the temperature of the semiconductor laser diode chip, using a thermoelectric element, the transmissive frequency separation of the wavelength-selective filter is determined by the following Equation 1.

Transmissive mode frequency separation of etalon
filter=$(Ff-Ff \times F\text{filter}/F\text{lsaser})$ GHz   [Equation 1]

(where Ff is a frequency separation of a desired transmissive wavelength, Ffilter is transmissive frequency mobility according to temperature of the etalon filter, and Flaser is frequency mobility according to temperature of laser light emitted from the laser diode chip).

Meanwhile, it is preferable that an optical intensity supervisory photodiode is disposed in the light path along which laser light emitted from the laser diode chip passes through the 45°-partial reflective mirror or an optical intensity supervisory photodiode is disposed in a light path along which laser light emitted from the rear side of the laser diode chip travels.

Further, it is preferable that the 45°-partial reflective mirror is inserted and fixed in a through-hole of a stand that is a hexahedral silicon substrate having a through-hole at an angle of 45° with respect to any one side by dry etching, and is installed at an angle of 45° with respect to a floor.

Regardless of the cases when the temperature of the semiconductor laser diode chip is not adjusted, when the temperature of the semiconductor laser diode chip is adjusted such that the wavelength of laser light emitted from the semiconductor laser diode chip is constant, and when the wavelength of laser light emitted from the semiconductor laser diode chip is changed in used, the temperature of the thermoelectric element or a heater of the wavelength-selective filter is adjusted such that a value obtained by dividing a current flowing to the optical wavelength supervisory photodiode by a current flowing to the optical intensity supervisory photodiode, so the oscillating wavelength of laser has a predetermined relationship with the transmissive wavelength band of the wavelength-selective filter, thereby performing filtering having relatively different transmittance for a "1" signal and a "0" signal of laser light emitted from the laser diode chip.

Meanwhile, the photodiode sub-mounts may be made of silicon, which is a base material, and have a metallic pattern continuous on a side {100} and a side {111} of the silicon.

Further, it is preferable that the temperature of the thermoelectric element is measured by a thermistor attached thereon, and the thermistor is electrically connected with an electrode pin through a thermistor connection sub-mount attached on the thermoelectric element separately from the thermistor.

In this configuration, the thermistor may be coated with a nonconductive polymer.

It is preferable that the 45°-partial reflective mirror 300 is 0.1 mm to 0.25 mm thick.

Further, the optical wavelength supervisory photodiode may be attached on the thermoelectric element.

The present invention has been proposed to solve the problems in the related art and an object of the present invention is to provide a compact and inexpensive TO type laser device that discharges laser light with an oscillating line breadth reduced, by reducing the line breadth of an optical signal by increasing ER that is the ratio of relative intensity of a "1" signal and a "0" signal by optically filtering laser light emitted from an DFB-LD chip.

In particular, an object of the present invention is to provide a compact tunable laser device that can be manufacture in a side capable of being mounted on an SFP transceiver standardized in the related art, by using an inexpensive TO type package and disposing a laser diode package so that the TO type package can be manufactured smaller than a butterfly type package of the related art.

Further, an object of the present invention is to provide a laser device with a wavelength stabilizer for providing a method of fixing a predetermined relative wavelength position between the wavelength of laser light emitted from a semiconductor laser diode chip and the transmissive wavelength band of an optical filter, when performing high-speed optical communication using DFB-LD (Distributed feedback laser diode).

Advantageous Effects

The present invention has an effect that in laser light for optical communication having a high-speed modulation signal over the 2.5 Gbps class or 10 Gbps class, a TO type package, which is inexpensive in comparison to a butterfly type or a mini flat type package housing and enables high-speed long-distance communication by inserting a wavelength-selective filter that performs selection such that a signal corresponding to a "1" signal is large and laser light corresponding to a "0" signal has low transmittance, is effectively used, so the manufacturing cost of an optical element for high-speed long distance is reduced.

Further, the present invention has an effect that regardless of the cases when the temperature of the semiconductor laser diode chip is not adjusted by a TO type package, when a laser diode chip has only a specific wavelength regardless of the external environment temperature, and when the wavelength of laser light emitted from a laser diode chip is changed in use regardless of an external environment, a high-speed optical signal is transmitted to far away.

DETAILED DESCRIPTION OF THE PREFERRED EMBODIMENTS

Preferred embodiments not limiting the present invention will be described hereafter in detail with reference to the accompanying drawings.

Figure 1:
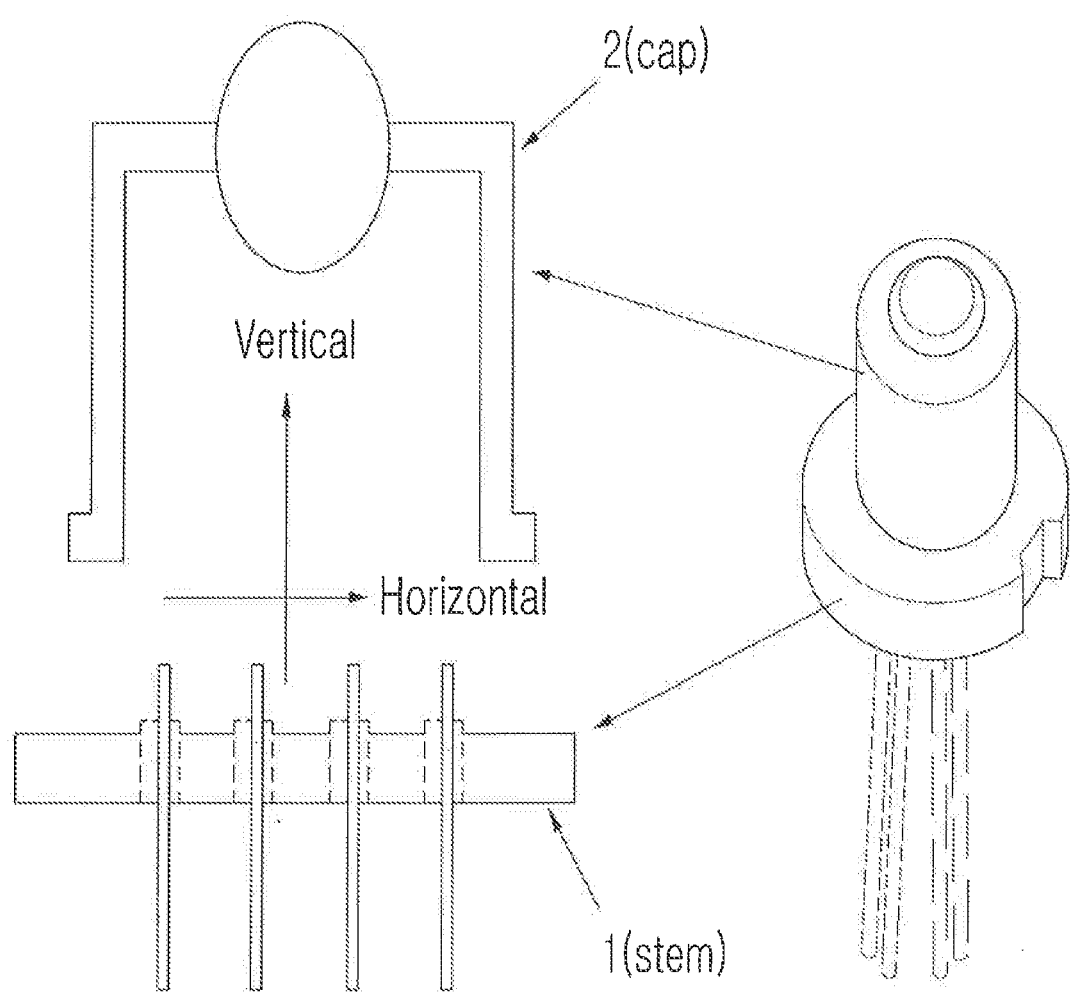
FIG. 1 is a diagram schematically illustrating the external form of a TO type package.

FIG. 1 is a diagram schematically illustrating a TO type package that is applied to the present invention.

As illustrated in FIG. 1, the TO type package includes a stem 1 and a cap 2, in which parts are disposed on the bottom of the stem 1 and then sealed by the cap 2. In this structure, laser light is discharged out of the TO type package through a through-hole formed through the top of the cap 2. In general, the through-hole of the cap 2 is sealed by a lens or a flat glass. In FIG. 1, a vertical direction and a horizontal direction to be used for describing the present invention are defined by arrows.

Figure 2:
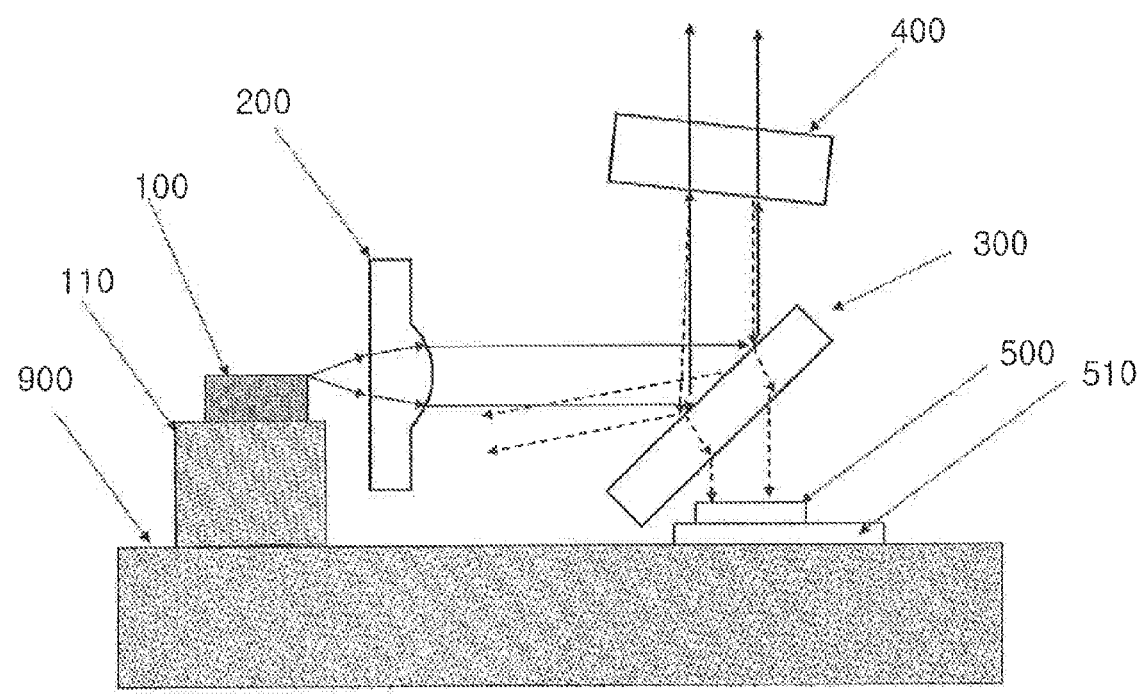
FIG. 2 is a conceptual diagram of a laser emitting laser light having a narrow line breadth to an optical fiber due to reduction of transmittance for a "0" signal in comparison to a "1" signal according to the present invention.

FIG. 2 is a conceptual diagram illustrating the operation principle of an optical element that can transmit an optical signal, for example, in the 10 Gbps class to a long distance by mounting a semiconductor laser diode chip and a wavelength-selective filter in a path of laser light emitted from the semiconductor laser diode chip in a TO type package according to the present invention.

Hereinafter, characteristics of the present invention are described by exemplifying an FP type etalon filter having a plurality of transmission peaks as a wavelength-selective filter for the convenience of description of the present invention, but a thin film filter having a line breadth of 0.5 nm or less may be used as the wavelength-selective filter, instead of the FP type etalon filter. The thin film filter means a filter having only one transmission peak in an available wavelength band of laser light generated from a laser diode chip, for example, within a wavelength band of 10 nm to 50 nm. In general, the thin film filter can have the structure of an FP etalon filter.

As illustrated in FIG. 2, a laser diode package according to the present invention includes: a laser diode chip 100 that is mounted on a sub-mount 110 for a laser diode chip; a collimating lens 200 that collimates a laser from the laser diode chip 100 into collimated light; a 45°-partial reflective mirror 300 that reflects only a predetermined ratio of light in laser light collimated through the collimating lens 200; and an FP type etalon filter 400 that is a wavelength-selective filter transmitting some laser light of laser light reflecting from the 45°-partial reflective mirror 300 and reflecting the other light. The light reflecting from the FP type etalon filter 400 returns to the 45°-partial reflective mirror 300, and a predetermined ratio of the light passes through the 45°-partial reflective mirror 300 and then travels into an optical wavelength supervisory photodiode 500 disposed under the 45°-partial reflective mirror 300.

Meanwhile, when the light reflecting from the etalon filter 400 reflects again from the 45°-partial reflective mirror 300 and returns to the laser diode chip 200, the operation characteristic of the laser diode chip 200 becomes unstable. In order to prevent it, as in FIG. 2, it is preferable that the etalon filter 400 is attached to have a reflection angle of at least 1 degree to laser light traveling into the etalon filter 400 to prevent light reflecting from the etalon filter 400 from returning to the laser diode chip 200.

Further, in FIG. 2, when the reflective of the 45°-partial reflective mirror 300 is high, the intensity of light traveling into the optical wavelength supervisory photodiode 500 weakens, so it is difficult to perform the function of monitoring a wavelength. In contrast, when the reflectivity of the 45°-partial reflective mirror 300 is too low, the intensity of light emitted from the laser diode chip 100 and reaching the etalon filter 400 weakens. Accordingly, the reflectivity of the 45°-partial reflective mirror 300 should be adjusted at a predetermined level, but according to a test result of an embodiment of the present invention, it is preferable that the reflectivity of the 45°-partial reflective mirror 300 is about 80% to 97%.

Figure 3:
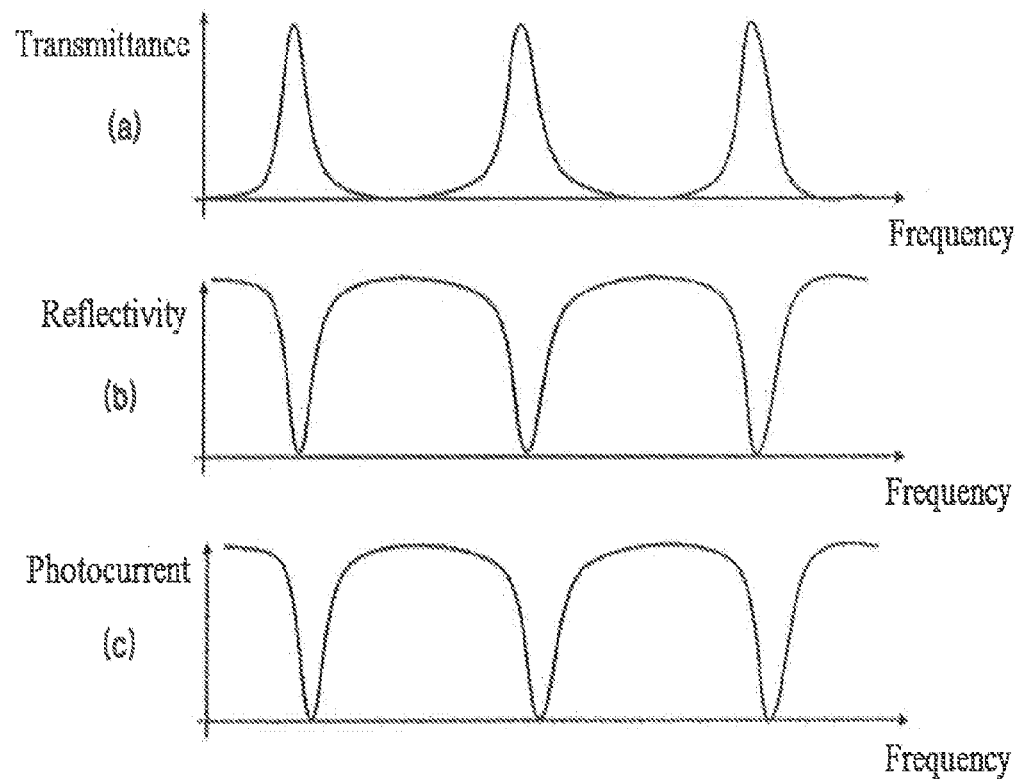
FIG. 3 is a conceptual diagram illustrating the function of a wavelength-selective filter in a narrow-line breadth laser according to the present invention, in which (a) of FIG. 3 is an example of a transmittance curve of a wavelength-selective filter, (b) of FIG. 3 is an example of reflectivity of the wavelength-selective filter, and (c) of FIG. 3 is an example of a photocurrent created by light traveling into an optical wavelength supervisory photodiode after reflected by the wavelength-selective filter.

(a) of FIG. 3 illustrates an example of a transmissive characteristic according to a frequency of the FP type etalon filter. An etalon filter has a characteristic that transmissive and reflective characteristics are periodically repeated.

The fact that the FP type etalon filter has a periodic transmissive characteristic means that it has a periodic reflective characteristic too, as in (b) of FIG. 3. Accordingly, in FIG. 2, laser light reflecting with a specific reflective ratio according to a frequency of laser light in the laser light emitted from the laser diode chip and reaching the FP type etalon filter 400 passes through the 45°-partial reflective mirror 300 and travels into the optical wavelength supervisory photodiode 500 under the 45°-partial reflective mirror 300. The reflective of light reflecting from the FP type etalon filter 400 has a specific reflective ratio in accordance with the frequency of laser light, as in (b) of FIG. 3, so the frequency dependency of the intensity of laser light traveling into the optical wavelength supervisory photodiode 500 is illustrated in (b) of FIG. 3, and accordingly, the photocurrent in the optical wavelength supervisory photodiode 500 shows the shape illustrated in (c) of FIG. 3 in accordance with the frequency of laser light. Accordingly, it is possible to find the frequency characteristic of laser light by measuring a photocurrent flowing in the optical wavelength supervisory photodiode 500. For example, when the intensity of a photocurrent flowing in the optical wavelength supervisory photodiode 500 changes with respect to the intensity of laser light emitted with a predetermined intensity from the laser diode chip 10, it means that the wavelength of the laser light and the counter-wavelength of the center wavelength of the etalon peak being changing.

Accordingly, it is possible to find that the wavelength of laser light and the counter-wavelength of the transmissive wavelength band of the etalon filter 400 change, by monitoring a change in current flowing to the optical wavelength supervisory photodiode 500, and thus, it is possible to give the wavelength of laser light a predetermined wavelength separation relationship relatively to the transmissive wavelength of the etalon filter 400. In general, the etalon filter 400 made of glass has a temperature dependency to a small wavelength of about 10 pm/° C., while DFB-LD has temperature dependency to a large wavelength of about 100 pm/° C. Accordingly, when an optical element is assembled, the peak of the etalon filter 400 is set to a frequency set in ITU, a wavelength emitted from the laser diode chip 100 is set to the peak of the etalon filter 400, and then a change in wavelength of laser light emitted from the laser diode chip 100 is found from a current flowing in the optical wavelength supervisory photodiode 500 and the temperature of the laser diode chip 100 is adjusted to offset the change, and accordingly, there is an effect that the oscillation wavelength of the laser diode chip 100 is stabilized to the frequency set in ITU. Further, when the wavelength of laser light and the transmissive wavelength band of the etalon filter 400 are set such that the wavelength of a "1" signal of laser light passes through the etalon filter 400 relatively well and a "0" signal of laser light cannot pass through the etalon filter 400 relatively well, attenuation of the "0" signal is larger than that of the "1" signal, so the light passing through the etalon filter 400 has a large ER than the laser light emitted from the laser diode chip 100, and thus signal discrimination in an optical receiver becomes easy.

The photocurrent flowing to the optical wavelength supervisory photodiode 500 changes due to a difference change between the reflectivity wavelength band of the etalon filter 400 and the wavelength of laser light, and the photocurrent flowing to the optical wavelength supervisory photodiode 500 changes also when the intensity of light emitted from the laser diode chip 100 changes. The change in photocurrent in the optical wavelength supervisory photodiode 500 due to the change in intensity of the laser light emitted from the laser diode chip 100 does not change the actual relationship between the etalon filter 400 and the wavelength of the laser light, so the effect due to a change in intensity of laser light emitted from the laser diode chip 100 should be removed.

Figure 4:
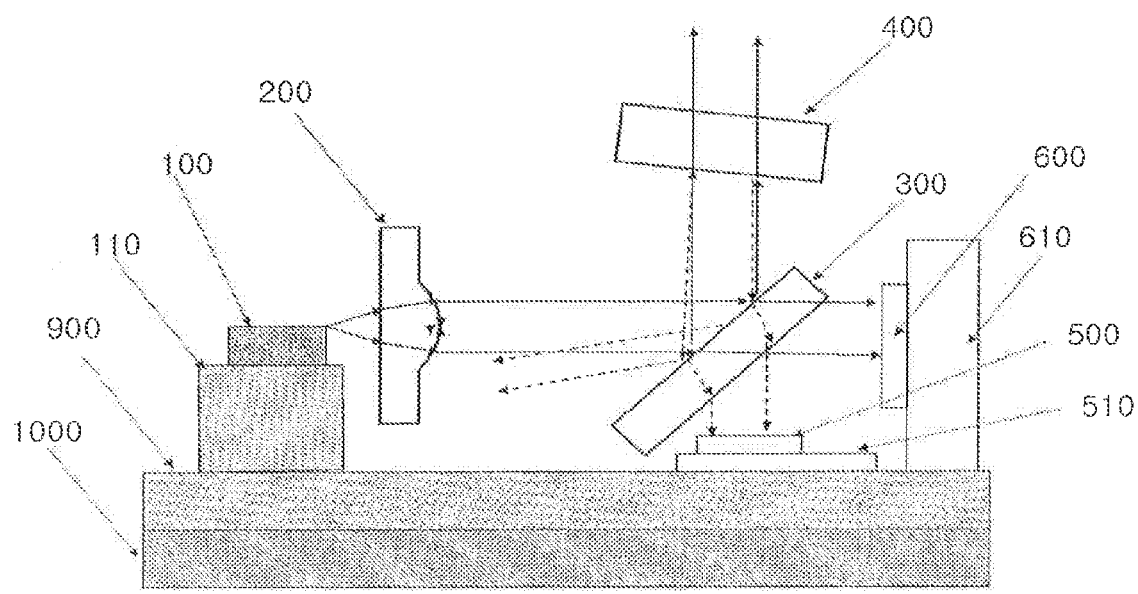
FIG. 4 is a conceptual diagram of a narrow-line breadth laser according to the present invention, that is, a conceptual diagram of a structure with an optical wavelength supervisory photodiode and an optical intensity supervisory photodiode.

FIG. 4 illustrates a method that can find only a change in optical wavelength by directly measuring the intensity of light emitted from a laser diode chip in an embodiment of the present invention.

As illustrated in FIG. 4, laser light emitted from the laser diode chip 100 is collimated by the collimating lens 200 and then reaches the 45°-partial reflective mirror 300. Since the 45°-partial reflective mirror 300 has a predetermined transmissive/reflective ratio, the light passing through the 45°-partial reflective mirror 300, in the light emitted from the laser diode chip 100 and reaching the 45°-partial reflective mirror 300, travels into the optical intensity supervisory photodiode 600 disposed at a side of the 45°-partial reflective mirror 300. Accordingly, the optical intensity supervisory photodiode 600 can find the intensity of the laser light emitted from the laser diode chip 100 by supplying a photocurrent signal proportioned to the intensity of the laser light emitted from the laser diode chip 100. Therefore, when the value obtained by dividing the magnitude of the photocurrent flowing to the optical wavelength supervisory photodiode 500 by the current flowing to the optical intensity supervisory photodiode 600 is maintained at a predetermined value, the center frequency of laser light has a predetermined relationship with the center frequency of a transmissive mode of the etalon filter 400 that is a wavelength-selective filter, so long-distance communication becomes possible by further attenuating the "0" signal relatively to the "1" signal. In FIG. 4, after the change relationship between the transmissive band center frequency of the etalon filter 400 and the center frequency of laser light is found by comparing the photocurrents flowing to the optical wavelength supervisory photodiode 500 and the optical intensity supervisory photodiode 600, laser light can have a predetermined wavelength relatively to the transmissive wavelength band of the etalon filter 400 by changing the temperature of the thermoelectric element 900 offsetting a change in optical wavelength of laser light with respect to the transmissive wavelength of the etalon filter 400, After the center frequency of the transmissive mode of the etalon filter 400 that is a wavelength-selective filter is set to the frequency set in ITU, when the temperature of the thermoelectric element 900 such that the value obtained by dividing the magnitude of the photocurrent flowing to the optical wavelength supervisory photodiode 500 by the current flowing to the optical intensity supervisory photodiode 600 is maintained, the center frequency of oscillating laser light can be stabilized to the frequency set in ITU. The thermoelectric element 900 of which the temperature is adjusted is disposed on a stem 1000.

Figure 5:
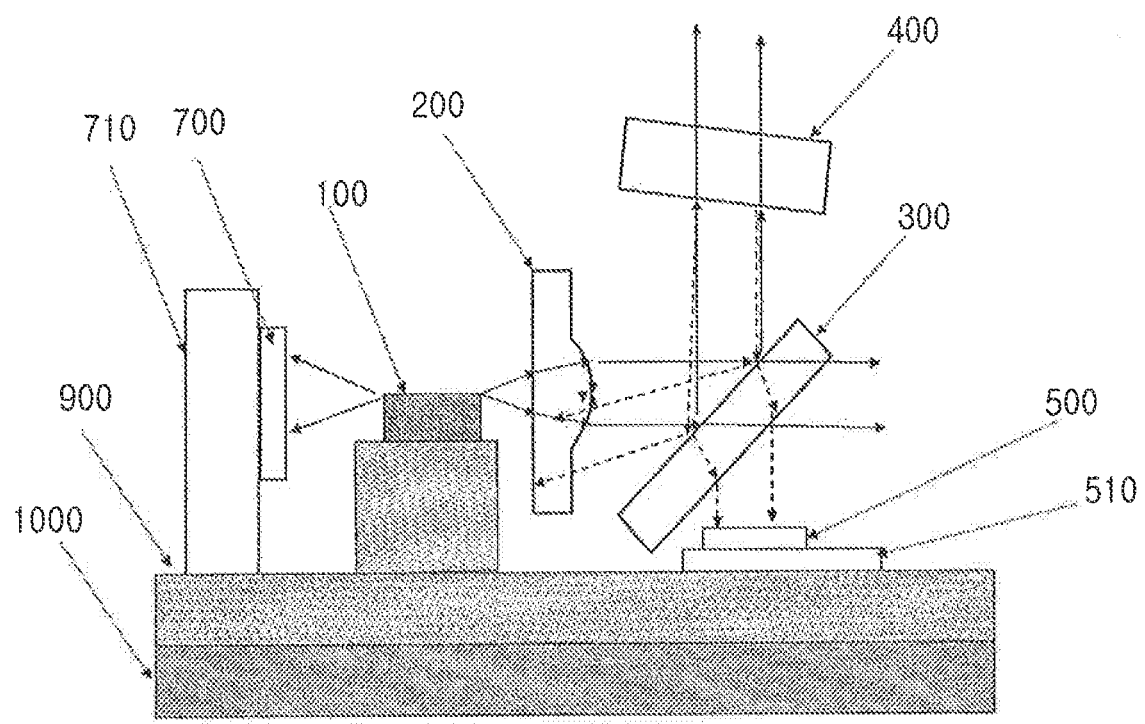
FIG. 5 is a conceptual diagram of a narrow-line breadth laser according to the present invention, that is, a conceptual diagram of another structure with an optical wavelength supervisory photodiode and an optical intensity supervisory photodiode.

The optical intensity supervisory photodiode 600 may be implemented by another configuration and the intensity of the laser light emitted from the laser diode chip 100 can be measured by disposing an optical supervisory intensity photodiode 700 that measures the intensity of laser light emitted from the rear side of the laser diode chip 100, as in FIG. 5.

Figure 6:
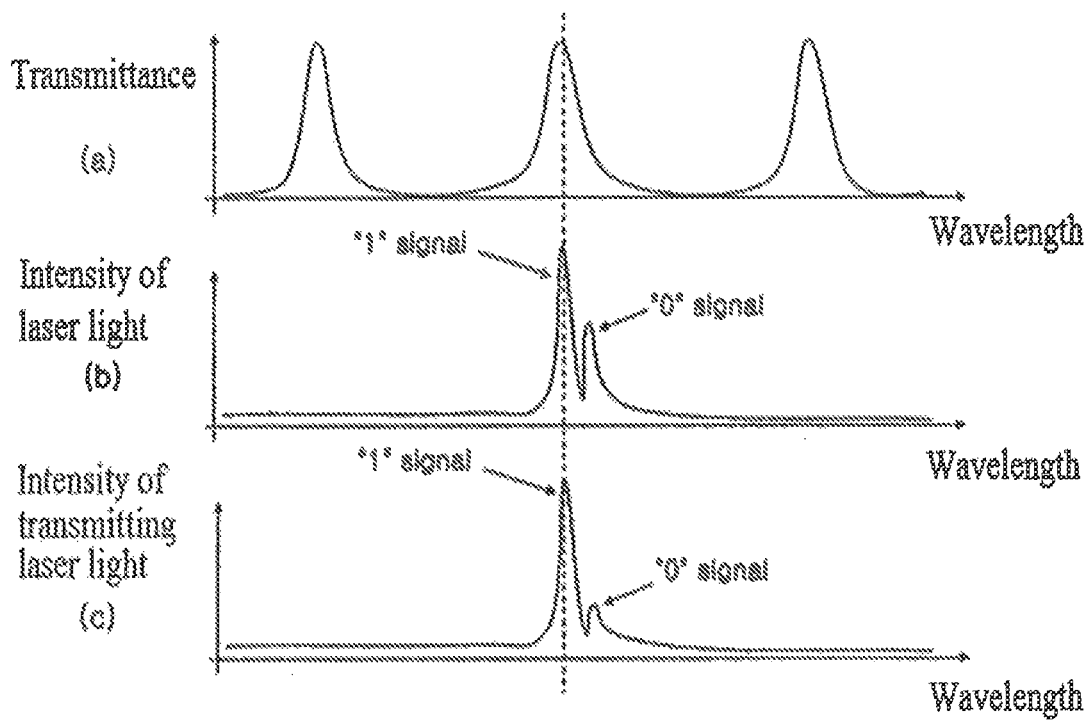
FIG. 6 is a conceptual diagram illustrating the operation principle of a narrow-line breadth laser according to the present invention, in which (a) of FIG. 6 is an example of transmittance of a wavelength-selective filter, (b) of FIG. 6 is an example of a frequency characteristic of laser light of a "1" signal and a "0" signal emitted from a laser diode chip when a laser diode chip is modulated at a high speed, (c) of FIG. 6 is a conceptual diagram illustrating a frequency characteristic of laser light of which the line breadth is reduced due to reduction of a "0" signal relative to a "1" signal of laser light passing through a wavelength-selective filter due to multiplication of a frequency characteristic of laser light emitted from a laser diode chip and transmittance of a wavelength-selective filter.

(a) of FIG. 6 is a transmissive characteristic according to a frequency of an FP type etalon filter. Further, (b) of FIG. 6 is a frequency characteristic of laser light of a "1" signal and a "0" signal emitted from a laser diode chip. Laser light of a "1" signal and a "0" signal emitted from the laser diode chip 100 is multiplied by the frequency characteristic of the FP type etalon filter 400 while passing through the etalon filter 400, and as in (c) of FIG. 6, the laser light with the intensity of the "0" signal reduced relatively to the "1" signal is collected to an optical fiber through the FP type etalon filter 400. Accordingly, in the laser light transmitted through an optical fiber, the "0" signal has a line width narrowed relatively to the "1" signal, as compared with the laser light emitted from the laser diode chip 100, it is less influenced by a distribution characteristic of an optical fiber, so longer-distance communication is possible relatively to the laser light without the line breadth narrowed, using the FP etalon filter 400.

Figure 7:
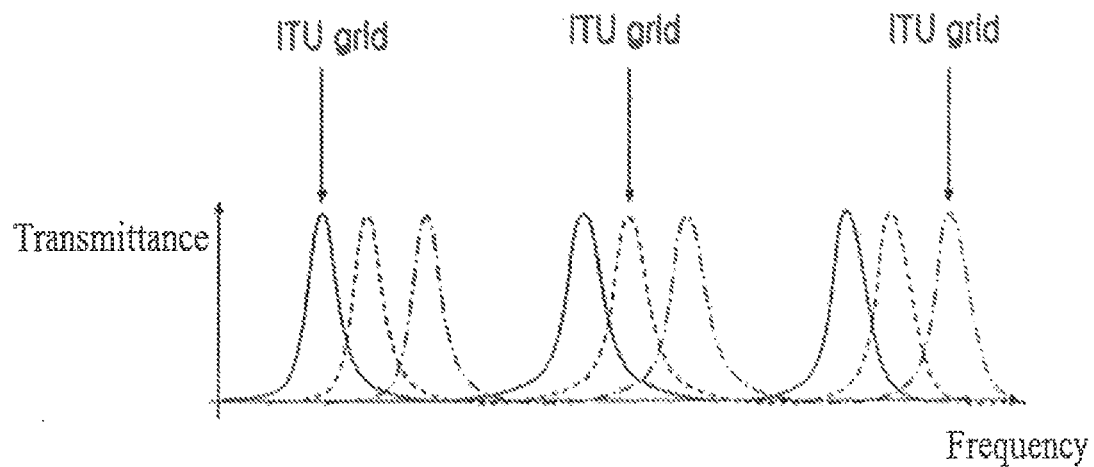
FIG. 7 is a conceptual diagram illustrating a change in frequency characteristic according to temperature of a wavelength-selective filter used in the present invention.

In general, a parallel side of the FP etalon filter 400 is made of glass. When it is made of glass, the refractive index depends on temperature, so when the FP etalon filter 400 changes in temperature, movement of a transmissive frequency of the etalon filter 400 that periodically changes is generated, as in FIG. 7.

The laser chip diode 100 generally leads frequency movement of about 10 to 12 GHz/° C. On the other hand, the FP type etalon filter 400 leads frequency movement of 1 to 3 GHz/° C. Optical communication requires laser light having a specific frequency determined by ITU-T, so it is required to change a wavelength only at the frequency set by ITU-T in order to perform optical communication by changing laser light.

Laser light having a frequency separation of 50 GHz and 100 GHz is set for communication by ITU-T, and accordingly, the frequency of laser light should be changed with a separation of 50 GHz and 100 GHz. Assuming that the laser diode chip 100 changes to 10 GHz/° C. and the FP type etalon filter 400 changes to 2 GHz/° C., when the laser diode chip 100 and the FP type etalon filter 400 are adjusted to the same temperature by the thermoelectric element 900, and when the temperature of the thermoelectric element 900 is changed to adjust the wavelength of laser light, the transmissive wavelength band of the etalon filter 400 is also moved. Accordingly, while temperature changes such that the wavelength of the laser light 100 changes to 50 GHz and 100 GHz, the transmissive wavelength of the etalon filter 400 should be matched with the frequency band set by ITU, after the temperature change.

Figure 8:
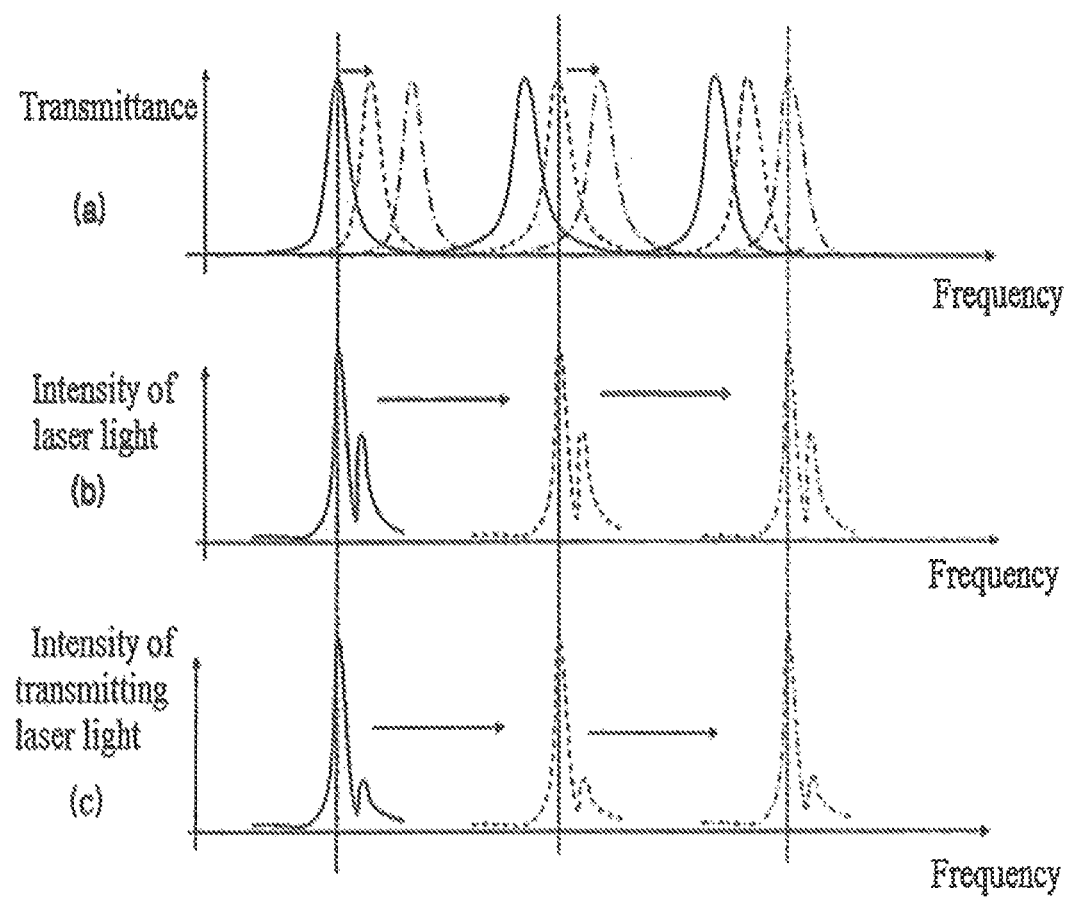
FIG. 8 is a diagram illustrating the operation of a laser device in which laser light, which is emitted from a laser diode using an FP type etalon filter having a periodic transmissive characteristic according to an embodiment of the present invention, changes and emits laser light corresponding to a plurality of ITU channel, in which (a) of FIG. 8 is an example of a change in transmissive frequency characteristic of a wavelength-selective filter according to temperature of a thermoelectric element, (b) of FIG. 8 is an example of a change in emission frequency characteristic according to temperature of a laser diode chip modulated at a high speed, and (c) of FIG. 8 is an example of a change in frequency characteristic according to temperature of laser light emitted after passing through a wavelength-selective filter.

Let's assume that the frequency mobility according to temperature of the laser diode chip 100 changes to Flaser GHz/° C. and the frequency of the etalon filter changes to Ffilter GHz/° C. in accordance with temperature. In this case, when the frequency separation of the transmissive wavelength bad of the etalon filter 400 is expressed as the following Equation 1, as in (b) of FIG. 8, and when the transmissive mode frequencies of the laser diode chip 100 and the etalon filter 400 are matched to the frequency set by ITU at any one temperature and then the frequency of the laser light emitted from the laser diode chip 100 changes to another frequency set by ITU at another temperature, the transmissive frequency of the etalon filter 400 is matched with the frequency set by ITU with respect to a temperature change, so the light passing through the etalon filter 400 is set to the frequency set by ITU.

Transmissive mode frequency separation of etalon filter=(100−100×Ffilter/Flsaser) GHz　　　[Equation 1]

where Ffilter is transmissive frequency mobility according to temperature of the etalon filter and Flaser is frequency mobility according to temperature of the laser light emitted from the laser diode chip.

Equation 1 illustrates a transmissive mode frequency separation of the etalon filter 400 in a tunable laser using the frequency with a separation of 100 GHz set by ITU, and if communication is performed using a frequency with a separation of 50 GHz, the transmissive mode frequency separation of the etalon filter 400 should be expressed by the following Equation 2.

Transmissive mode frequency separation of etalon filter=(50−50×Ffilter/Flsaser) GHz　　　[Equation 2]

As described above, the transmissive mode separation of the etalon filter 400 can be freely determined, and generally, it may be changed to 25 GHz, 50 GHz, 100 GHz, and 200 GHz, but other optional frequency separations can be adopted.

In the description of FIGS. 2 to 9, it is described that a wavelength filter of which the transmissive wavelength change is small relatively to laser light oscillated from the laser diode chip 100 according to a change in temperature is used. That is, a method of giving the wavelength of laser light a predetermined relationship with the transmissive wavelength band of a wavelength-selective filter by changing the temperature of the laser diode chip 100 is illustrated. Accordingly, there is a need for a method of disposing the laser diode chip 100 on the thermoelectric element 900 and a method of adjusting the temperatures of the laser diode chip 100 and the etalon filter 400 with the same thermoelectric element 900 by attaching the etalon 400 to the thermoelectric element 900 is illustrated. However, the method of using the thermoelectric element 900 is a method consuming a large amount of energy. In particular, when the thermoelectric element 900 is used in a cooling mode, a large amount energy is consumed.

The method of adjusting the wavelength of the laser light emitted from the laser diode chip 100 by adjusting the temperature of the laser diode chip 100 using the thermoelectric element 900 enables not only long-distance transmission of a high-speed modulated optical signal by enlarging the ER of a "1" signal and a "0" signal emitted from the laser diode chip 100, by keeping the relationship between the wavelength of laser light and the wavelength of the etalon filter 400 constant, but fixes the wavelength of laser light, so it is a method suitable for DWDM.

However, when there is no need to adjust the wavelength of laser light and there is a need for long-distance transmission of a high-speed modulation signal, it is not required to adjust the temperature of the laser diode chip 100. Further, when the transmissive wavelength band of the etalon filter 400 is made maintain a predetermined wavelength separation from the wavelength of laser light by adjusting the temperature of the etalon filter 400, the "0" signal is further attenuated than the "1" signal, so laser light having a narrow line breadth is produced and long-distance transmission can be possible. To this end, it is preferable to user an etalon filter coated with a heater as the etalon filter 400.

Figure 9:
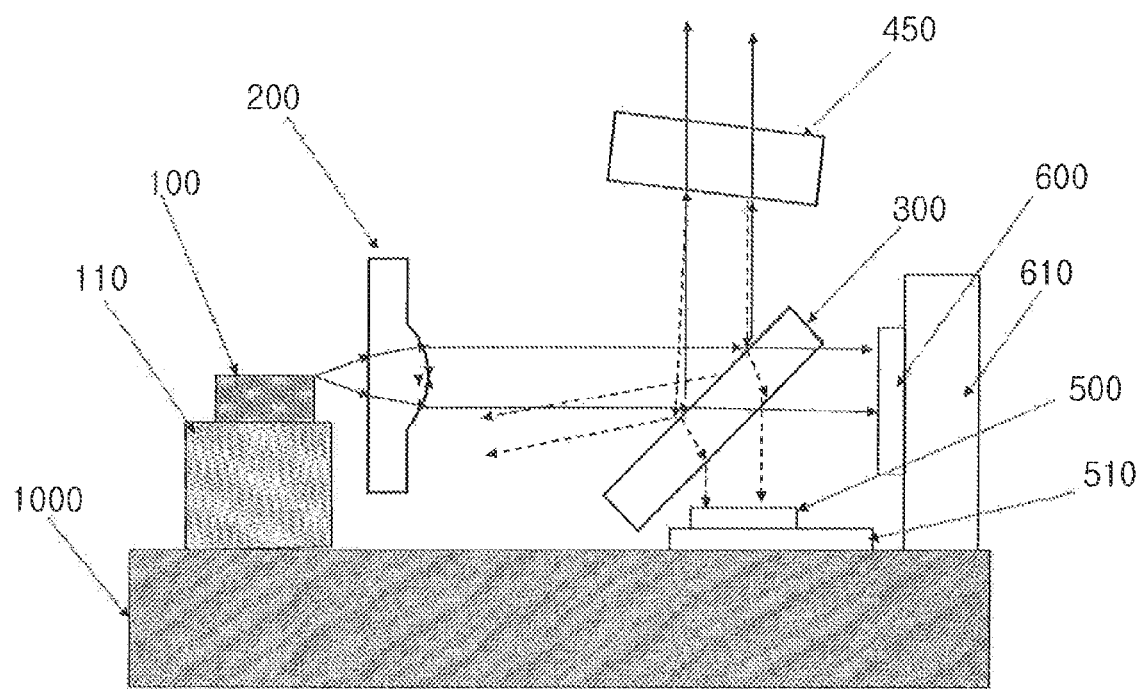
FIG. 9 illustrates a case when a sub-mount with a laser diode chip attached thereon is disposed directly on a stem bottom, without a thermoelectric element mounted on a TO type package according to another embodiment of the present invention.

FIG. 9 illustrates a case when a sub-mount with a laser diode chip attached thereon is disposed directly on a stem bottom, without a thermoelectric element mounted on the TO type package according to another embodiment of the present invention. The temperature of the laser diode chip 100 is exposed to an external environment temperature, so when the external environment temperature changes, the temperature of the laser diode chip 100 changes, and accordingly, the wavelength of oscillated laser light changes. When a heater is attached to the etalon filter 450, the transmissive wavelength peak of the etalon filter 450 can have a predetermined wavelength separation from the wavelength of laser light by adjusting the temperature of the etalon filter 450, and accordingly, the "0" signal of the laser light passing through the etalon filter 450 is further attenuated than the "1" signal, so a high-speed modulated optical signal can be transmitted further away. In the structure of FIG. 9, it is preferable that the transmissive wavelength of the etalon filter 450 easily changes in accordance with temperature, and to this end, it is suitable that the etalon filter 450 is made of silicon or a semiconductor material such as InP and GaAs that changes the wavelength of the transmissive wavelength by about 0.09 nm/° C. Further, it is preferable to attach a metallic thin film resistance to the surface of the etalon filter 450 in order to adjust the temperature of the etalon filter 450 so that the temperature of the etalon filter 450 is adjusted by a current flowing to the metallic thin film attached to the etalon filter 450. Attaching a metallic thin film to the etalon filter can be easily achieved by photolithograph and metal deposition. Further, it is preferable for the etalon filter 450 has a plurality of transmissive peaks and it is suitable that the etalon filter 450 is about 200 nm to 500 nm thick in consideration of easiness of manufacturing an optical element and the wavelength separation between the plurality of transmissive peaks of the etalon filter 450.

Figure 10:
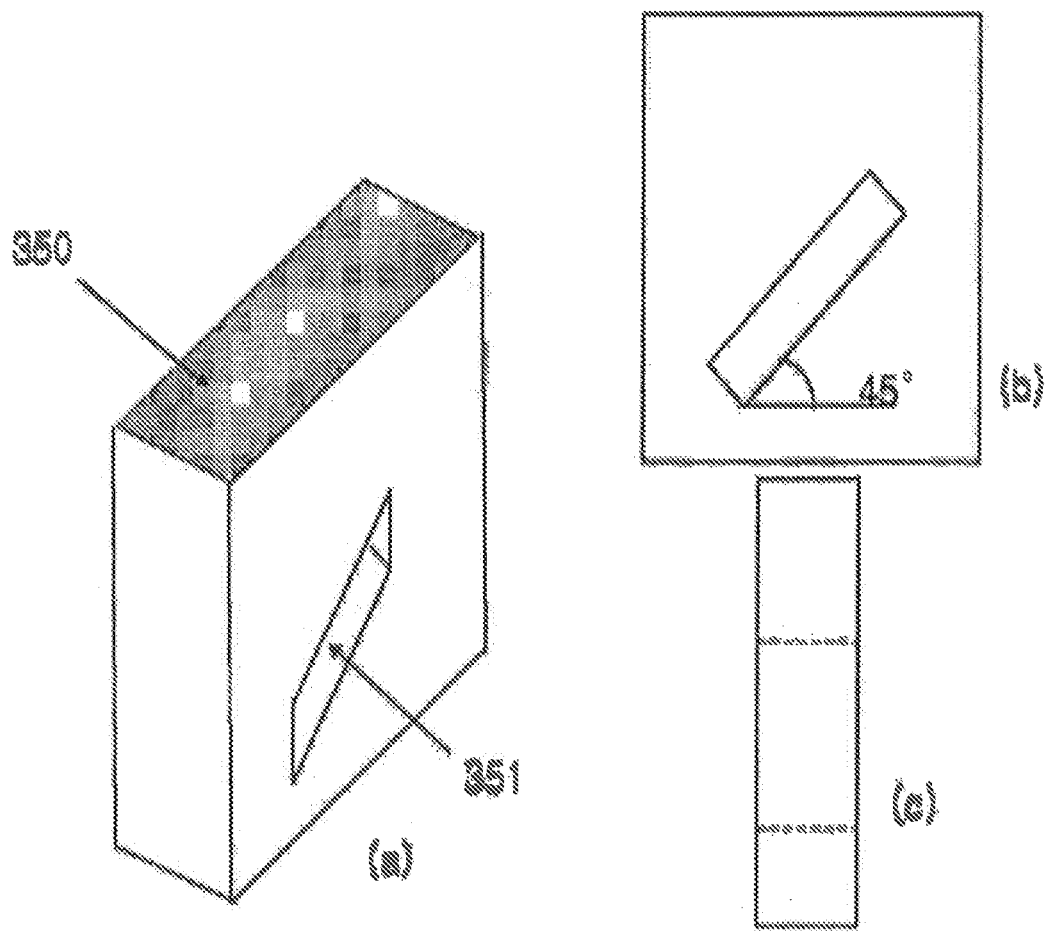
FIG. 10 is a conceptual diagram illustrating installation of a stand making it easy to fix a 45°-reflective mirror according to an embodiment of the present invention.

FIG. 10 is a diagram illustrating a stand for a 45°-reflective mirror that is provided to easily mount the 45°-reflective mirror on a TO type package according to an embodiment of the present invention.

A stand 350 according to an embodiment of the present invention is manufactured in a hexahedral shape and has a through-hole 351 at an angle of 45° with respect to the bottom, and a flat plate-shaped 45°-partial reflective mirror 300 is inserted in the through-hole 351 and mounted on a thermoelectric element. This structure makes it easy to attach the 45°-partial reflective mirror 300 to the thermoelectric element 900. A material having a high heat transfer rate is suitable for the stand 350 and a silicon substrate that has a heat transfer rate of 170 W/m and allows easy forming of the through-hole 351 through dry etching is suitable for the material. In particular, it is very easy to adjust the width of the through-hole 351 through dry etching and easy to adjust the angle with respect to the bottom, so the flat plate-shaped partial reflective mirror 300 can be arranged at 45° by only inserting the flat plate-shaped partial reflective mirror 300 in the through-hole 351 of the silicon stand 300, thereby making an assembly process easy.

In general, when the external environment temperature around a TO type package variously changes, heat transfers between the outer side of the TO type package and the parts in the TO type package. The distances between the parts in the TO type package and the outer side of the TO type package can be variously changed, so a change in external environment temperature around the TO type package may non-uniformly change the temperature of the parts in the TO type package. The individual change in temperature of the material of a resonator non-uniformly changes the effective optical length of the resonator, so it is preferable to minimize heat transfer between the parts of the resonator and the TO type package. Accordingly, it is preferable to keep the inside of the TO type package vacuum and, particularly, the degree of vacuum is more preferably 0.2 atmospheric pressure or less.

On the other hand, the present invention can be modified in various ways. For example, the characteristic of the present invention can be driven by a laser that is driven at a specific wavelength without using a tunable laser, in which there is no need of periodicity of the frequency separation of the etalon filter 400, so the periodicity of the frequency of the etalon filter 400 does not need to follow Equation 1. Further, when the characteristic of the present invention is to use a laser operating at a specific wavelength, instead of the FP type etalon filter 400, any kind of filter having wavelength selectivity such as a thin film filter manufactured by staking a plurality of dielectric thin films having high and low refractive indexes on a transparent substrate for laser light having a concerned wavelength such as a glass or quartz may be used.

Further, for the flat plate-shaped 45°-partial reflective mirror 300, when the thickness is too large, it is difficult to insert to a limited size of T-060, and when the thickness is too small, the mechanical strength decreases. Accordingly, it is suitable that the thickness of the flat plate-shaped 45°-partial reflective mirror 300 is about 0.1 to 0.3 nm to fit to the size of T060, and more preferably, it is about 0.1 to 0.2 mm.

Figure 11:
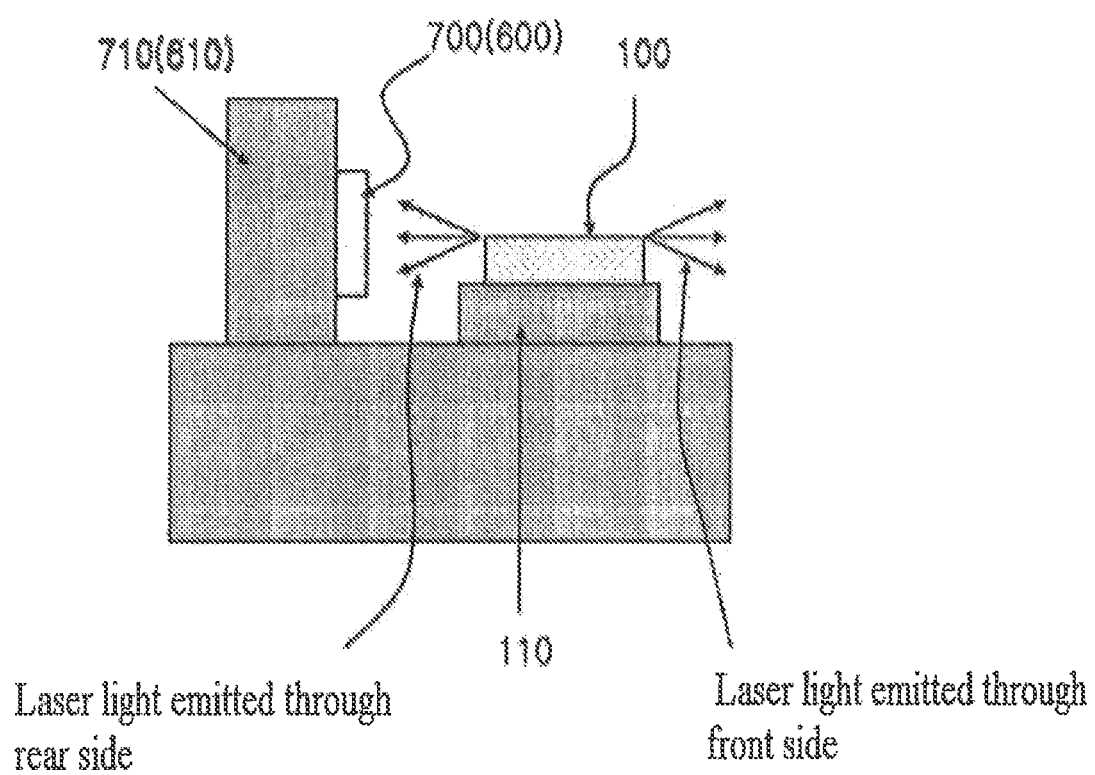
FIG. 11 is a conceptual diagram of a photodiode measuring the intensity of laser light emitted from a laser diode chip.

FIG. 11 is a conceptual diagram of installation of a photodiode measuring the intensity of laser light emitted from a laser diode chip, illustrating photodiodes 700 and 710 attached to photodiode sub-mounts 710 and 610 having a rectangular cross-section generally used to measure the intensity of laser light emitted with a horizontal optical axis from the laser diode chip 100.

Figure 12:
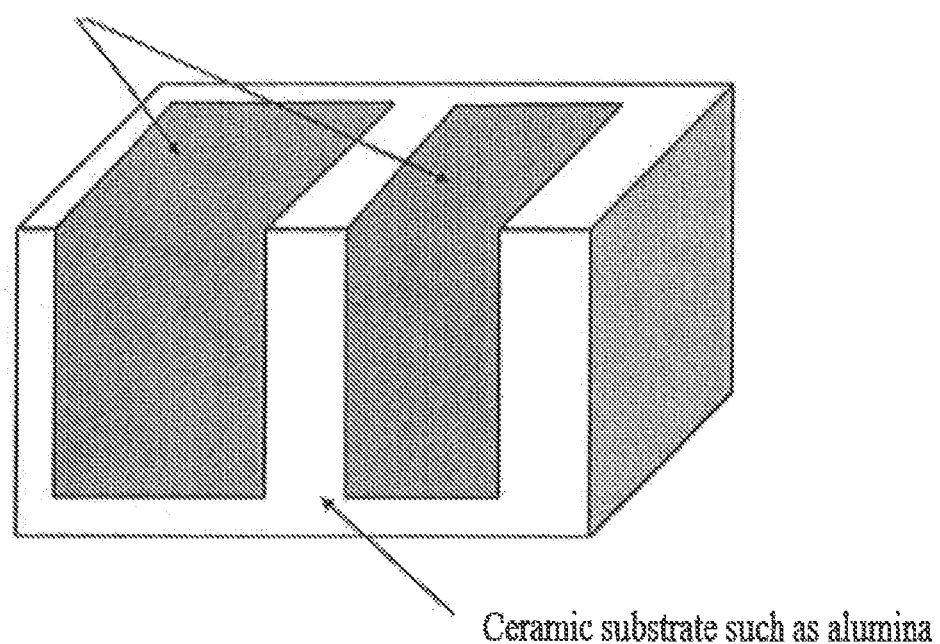
FIG. 12 is an example of a hexahedral photodiode sub-mount having a rectangular shape.

FIG. 12 illustrates an example of a hexahedral sub-mount having a rectangular shape for a photodiode.

In FIG. 12, there is a need for forming a metallic thin film pattern by depositing a metallic pattern for electric connection of a photodiode on a sub-mount having a rectangular cross-section which is a ceramic substrate made of aluminum etc., but it is difficult to deposit at a time a metallic pattern on two sides continuously bending at the right angle. Accordingly, a metallic pattern is coated in the related art, but a metallic pattern is separately deposited on each side, so the cost increases.

Figure 13:
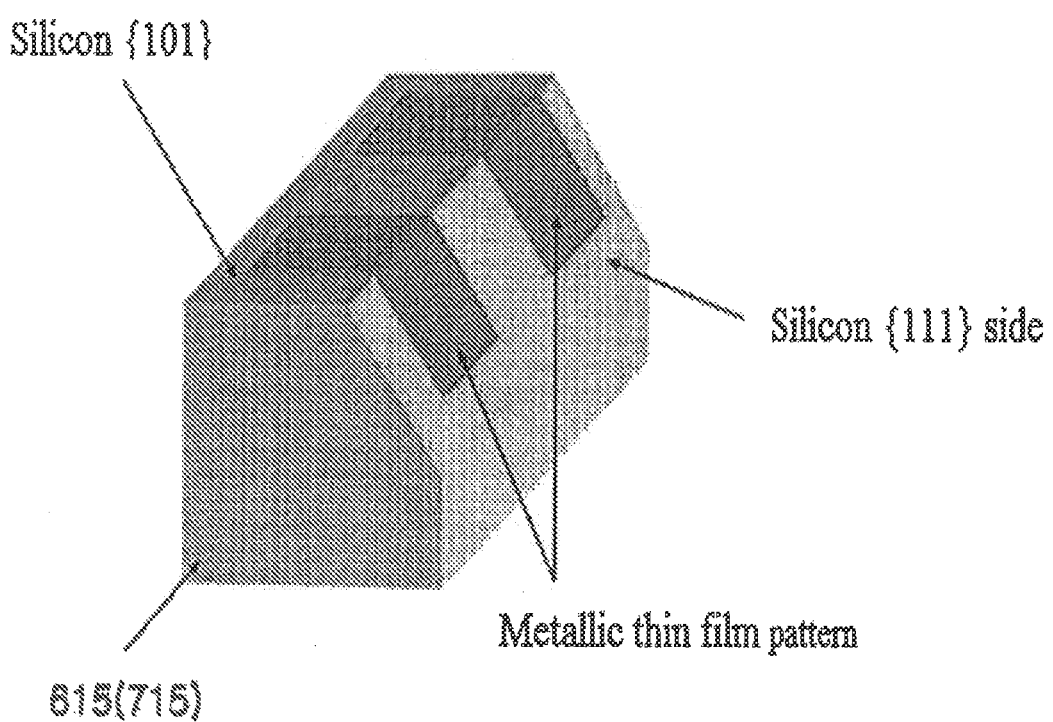
FIG. 13 is an example of a metal pattern deposition of a photodiode sub-mount according to an embodiment of the present invention.

For this problem, the present invention proposes a method of depositing a metallic pattern at a time on a photodiode sub-mount and FIG. 13 illustrates an example of metallic pattern deposition on a photodiode sum-mount.

As illustrated in FIG. 13, in an embodiment of the present invention, there is proposed a method of manufacturing the photodiode sub-mounts 615 and 715 by etching a silicon substrate such that a side {100} and a side {111} are exposed, depositing an electric insulating film on the etched silicon substrate, and then simultaneously depositing a metallic pattern on the side {100} and the side {111}. The photodiode sub-mounts 615 and 715 manufactured in this way is manufactured at a low cost, and unlike the photodiode sub-mounts 610 and 710 having a rectangular cross-section, the difference between the arrangement angle of the photodiodes 600 and 700 and angle of the flat plate-shaped 45°-partial reflective mirror 300 is small, they can be arranged in closer contact with the flat plate-shaped 45°-partial reflective mirror 300, so it contributes to using the inside of the TO package.

On the other hand, in order to stabilizer the wavelength of the laser device, a thermistor mounted on the thermoelectric element 900 in the package and measuring temperature should not be influenced by an temperature change outside the TO package.

Figure 14:
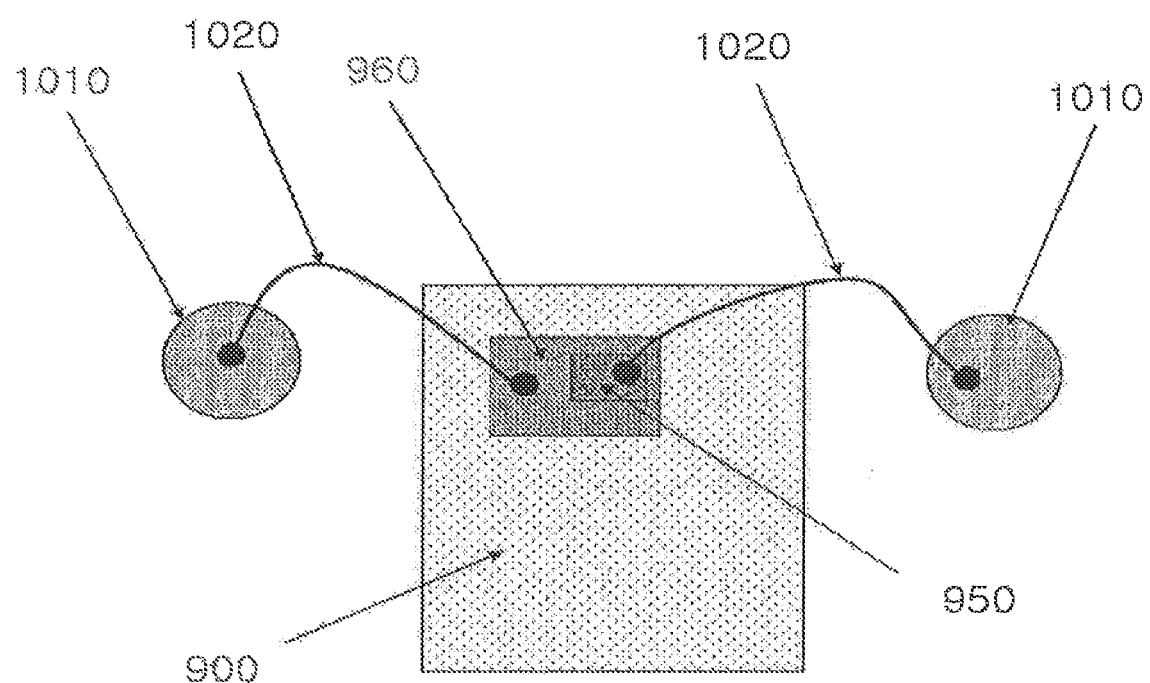
FIG. 14 is an example of a method of arranging a common thermistor of the related art.

FIG. 14 illustrates a method of disposing a common thermistor in the related art, in which a thermistor 950 is electrically connected with an electrode pin 1010 through an Au wire 1020. The electrode pin 1010 is not a part of which the temperature is adjusted by the thermoelectric element 900, so it has a temperature different from the thermoelectric element 900. Accordingly, heat transfer is generated between the electrode pin 1010 and the thermistor 950, it causes inaccuracy when the thermistor 950 measures the temperature of the thermoelectric element 900.

Figure 15:
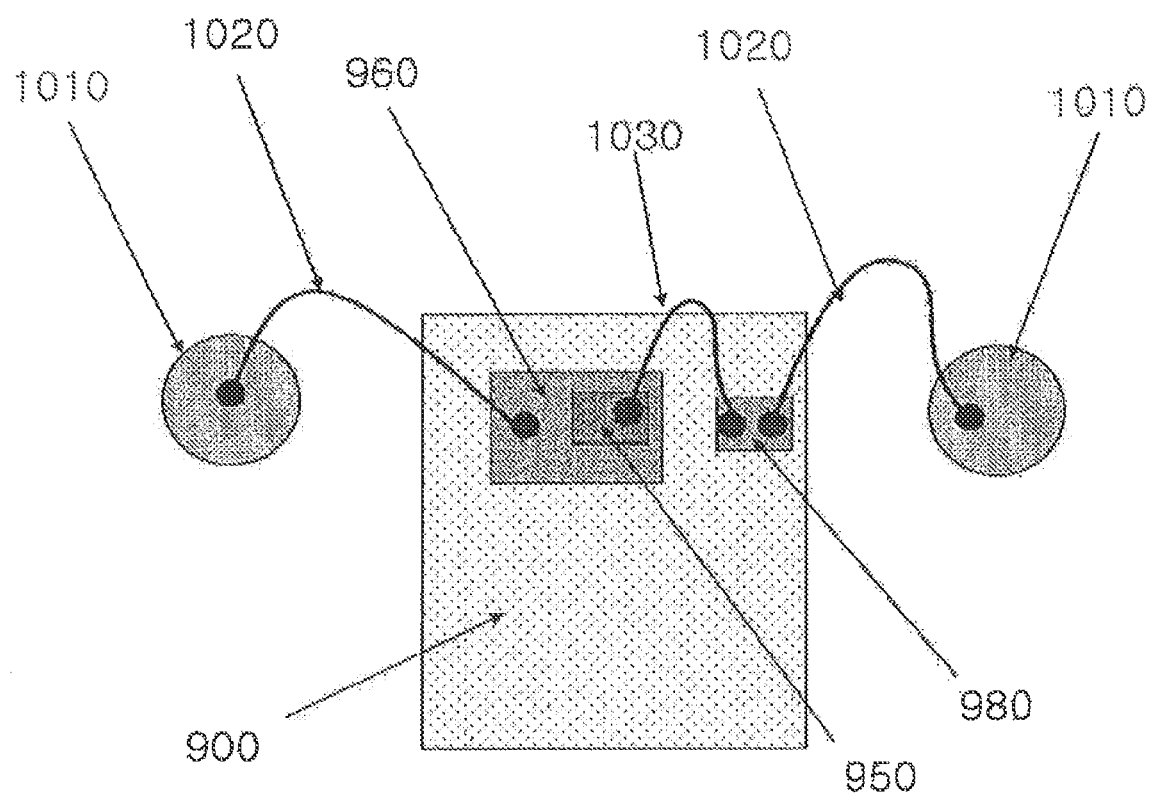
FIG. 15 is an example of a method of arranging a thermistor according to an embodiment of the present invention.

FIG. 15 illustrates a method of disposing a thermistor according to an embodiment of the present invention for this problem.

As illustrated in FIG. 15, in an embodiment of the present invention, a thermistor connection sub-mount 980 is attached between the electrode pin 1010 and the thermistor 950 to suppress heat transfer of the electrode pin 1010 and the thermistor 950, so the electrode pin 1010 and the thermistor connection sub-mount 980 are connected to the Au wire 1020 through the thermistor connection sub-mount 980, and the thermistor connection sub-mount 980 and the thermistor 950 are connected to an Au wire 1030. Accordingly, due to a temperature difference of the electrode pin 1010 and the thermoelectric element 900, heat flowing to the Au wire 1020 is absorbed by the thermistor connection sub-mount 980 and the amount of heat flowing to the Au sire is minimized, so that it is possible to more accurately measure the temperature of the thermistor 950. As described above, when the thermistor 950 and the electrode pin 1010 are electrically connected through the thermistor connection sub-mount 980 independently attached to the top of the thermoelectric element 900, separately from a heat path between the thermoelectric element 900 and the thermistor 950, inaccuracy due to a change in external environment temperature when the thermistor 950 measures the temperature of the thermoelectric element 900 can be reduced.

Further, heat transfer between the thermistor 950 and the air in the TO package causes inaccuracy when the thermistor 950 measures the temperature of the thermoelectric element 900, so covering the thermistor 950 with nonconductive epoxy is a method of increasing accuracy in measuring of the temperature of the thermoelectric element 900.

On the other hand, when the 45°-partial reflective mirror 300 is too thick, the inside of the package reduces, and when it is too thin, shaking due to vibration may be caused. In the present invention, tests was conducted for various thicknesses of the 45°-partial reflective mirror 300, and according to the test results, it is preferable that the 45°-partial reflective mirror 300 is about 0.1 mm to 0.25 mm thick.

Further, although the optical wavelength supervisory photodiode 500 disposed under the 45°-partial reflective mirror 300 is fixed to a side of the upper portion of an optical wavelength supervisory photodiode sub-mount 510 in the above description, the optical wavelength supervisory photodiode 500 may be disposed on the thermoelectric element 900. This is because the top plate of the thermoelectric element 900 has thermal expansivity similar to the optical wavelength supervisory photodiode 500 and dynamic stress exerted in the optical wavelength supervisory photodiode 500 is minimized, so the optical wavelength supervisory photodiode 500 can be attached directly to the top of the thermoelectric element 900. In this case, it is possible to maximally efficiently use the space under the 45°-partial reflective mirror 300.

The present invention, which can be modified in various ways, is not limited to the embodiments described above and it should be understood that the present invention may be changed and modified in various ways by those skilled in the art within a range equivalent to the spirit of the present invention and claims to be described below.

[Description of Main Reference Numerals of Drawings]

| | |
|---|---|
| 100: Laser diode chip | 110: Laser diode chip sub-mount |
| 200: Collimating lens | 300: 45°-partial reflective mirror |
| 350: 45°-partial reflective mirror 300 stand | |
| 351: Through-hole | 400: FP type etalon filter |
| 450: Etalon filter with heater | |
| 500: Optical wavelength supervisory photodiode | |
| 510: Optical wavelength supervisory photodiode sub-mount | |
| 600: Optical intensity supervisory photodiode | |
| 610: Optical intensity supervisory photodiode sub-mount | |
| 700: Optical intensity supervisory photodiode | |
| 710: Optical intensity supervisory photodiode sub-mount | |
| 615, 715: Photodiode sub-mount | |
| 900: Thermoelectric element | 950: Thermistor |
| 960: Thermistor sub-mount | |
| 980: Thermistor connection sub-mount | |
| 1000: Stem | 1010: Electrode pin |
| 1020, 1030: Au wire | |

The invention claimed is:

1. A semiconductor laser device comprising:
    a laser diode chip (100) that emits laser light;
    a wavelength-selective filter;
    a collimating lens (200) that is disposed in a light path between the laser diode chip (100) and the wavelength-selective filter and collimates light emitted from the laser diode chip (100);
    a 45°-partial reflective mirror (300) that is disposed in a light path between the laser diode chip (100) and the wavelength-selective filter and changes laser light traveling parallel to a bottom of a package into laser light traveling perpendicularly to the bottom of the package;
    an optical wavelength supervisory photodiode (500) that is disposed in a light path along which laser light reflecting from the wavelength-selective filter after being emitted from the laser diode chip (100) passes through the 45°-partial reflective mirror (300);
    wherein an optical intensity supervisory photodiode (600) is disposed in the light path along which laser light emitted form the laser diode chip (100) passes through the 45°-partial reflective mirror (300); and
    wherein an oscillating wavelength of a laser is stabilized by adjusting temperature of a thermoelectric element (900) such that a value obtained by dividing a current flowing to the optical wavelength supervisory photodiode (500) by a current flowing to the optical intensity supervisory photodiodes (600, 700) is the minimum.

2. The laser device of claim 1, wherein the laser diode chip (100) and the wavelength-selective filter are disposed on one thermoelectric element (900).

3. The laser device of claim 2, wherein the temperature of the thermoelectric element (900) is measured by a thermistor (950) attached thereon, and the thermistor (950) is electrically connected with an electrode pin (1010) through a thermistor connection sub-mount (980) attached on the thermoelectric element (900) separately from the thermistor (950).

4. The laser device of claim 3, wherein the thermistor (950) is coated with a nonconductive polymer.

5. The laser device of claim 1, wherein the wavelength-selective filter is an FP type etalon filter (400).

6. The laser device of claim 5, wherein a transmissive frequency separation of the FP type etalon filter (400) is determined by the following equation:

Transmissive mode frequency separation of etalon filter=$(Ff-Ff \times F\text{filter}/F\text{laser})$ GHz where Ff is a frequency separation of a desired transmissive wavelength, Ffilter is transmissive frequency mobility according to temperature of the etalon filter, and Flaser is frequency mobility according to temperature of laser light emitted from the laser diode chip.

7. The laser device of claim 6, wherein the frequency separation of the desired transmissive wavelength is any one of 25, 50, 100, and 200.

8. The laser device of claim 1, wherein the wavelength-selective filter is manufactured by stacking dielectric thin films having high and low refractive indexes.

9. The laser device of claim 1, wherein an optical intensity supervisory photodiode (700) is disposed in a light path along which laser light emitted from a rear side of the laser diode chip (100) travels.

10. The laser device of claim 1, wherein a line breadth of a transmissive wavelength band of the wavelength-selective filter is 0.5 nm or less.

11. The laser device of claim 1, wherein the 45°-partial reflective mirror (300) is inserted and fixed in a through-hole (351) of a stand (350) that is a hexahedral silicon substrate having a through-hole (351) at an angle of 45° with respect to any one side by dry etching, and is installed at an angle of 45° with respect to a floor.

12. The laser device of claim 1, wherein a photodiode sub-mounts (610, 710) is made of silicon, which is a base material, and has a metallic pattern continuous on a first side (101) and a second side (111) of the silicon.

13. The laser device of claim 1, wherein the 45°-partial reflective mirror (300) is 0.1 mm to 0.25 mm thick.

14. The laser device of claim 1, wherein the optical wavelength supervisory photodiode (500) is attached on the thermoelectric element (900).

15. The laser device of claim 1, wherein the wavelength-selective filter is manufactured by stacking dielectric thin films having high and low refractive indexes on either a glass or a quartz substrate.

16. The laser device of claim 1, wherein the wavelength-selective filter is manufactured by stacking dielectric thin films having high and low refractive indexes on a semiconductor substrate including any one of silicon, InP, and GaAs.

17. The laser device of claim 16, wherein a thin film heater is further attached to the wavelength-selective filter.

18. A semiconductor laser device comprising:
    a laser diode chip (100) that emits laser light;
    a wavelength-selective filter;
    a collimating lens (200) that is disposed in a light path between the laser diode chip (100) and the wavelength-selective filter and collimates light emitted from the laser diode chin (100);
    a 45°-partial reflective mirror (300) that is disposed in a light path between the laser diode chip (100) and the wavelength-selective filter and changes laser light traveling parallel to the bottom of a package into laser light traveling perpendicularly to the bottom of the package;
    an optical wavelength supervisory photodiode (500) that is disposed in a light path along which laser light reflecting from the wavelength-selective filter after being emitted from the laser diode chip (100) asses through the 45'-partial reflective mirror (300);

wherein an optical intensity supervisory photodiode (600) is disposed in the light path along which laser light emitted from the laser diode chip (100) passes through the 45°-partial reflective mirror (300); and wherein the laser diode chip (100) and the wavelength-selective filter are disposed on one thermoelectric element (900) and the temperature of the thermoelectric element (900) is adjusted such that ratios of a photocurrent flowing to the optical wavelength supervisory photodiode (500) and a photocurrent flowing to the optical intensity supervisory photodiode (600, 700) is constant.

19. A semiconductor laser device comprising:

a laser diode chip (100) that emits laser light;

a wavelength-selective filter;

a collimating lens (200) that is disposed in a light path between the laser diode chip (100) and the wavelength-selective filter and collimates light emitted from the laser diode chip (100);

a 45°-partial reflective mirror (300) that is disposed in a light path between the laser diode chip (100) and the wavelength-selective filter and changes laser light traveling parallel to the bottom of a package into laser light traveling perpendicularly to the bottom of the package;

an optical wavelength supervisory photodiode (500) that is disposed in a light path along which laser light reflecting from the wavelength-selective filter after being emitted from the laser diode chip (100) passes through the 45°-partial reflective mirror (300);

wherein an optical intensity supervisory photodiode (600) is disposed in the light path along which laser light emitted from the laser diode chip (100) passes through the 45°-partial reflective mirror (300); and wherein the wavelength-selective filter is manufactured by stacking dielectric thin films having high and low refractive indexes on a semiconductor substrate including any one of silicon, InP, and GaAs and the temperature of the wavelength-selective filter is adjusted such that ratios of a photocurrent flowing to the optical wavelength supervisory photodiode (500) and a photocurrent flowing to the optical intensity supervisory photodiodes (600, 700) is constant.

* * * * *